United States Patent

Merkenschlager

[15] 3,675,318

[45] July 11, 1972

[54] PROCESS FOR THE PRODUCTION OF A CIRCUIT BOARD

[72] Inventor: Hans-Hermann Merkenschlager, Munich, Germany

[73] Assignee: Siemens Aktiengesellschaft, Berlin and Munich

[22] Filed: May 11, 1970

[21] Appl. No.: 35,959

[30] Foreign Application Priority Data

May 14, 1969 Germany ......................P 19 24 775.7

[52] U.S. Cl. ....................................................................29/624

[51] Int. Cl. ........................................H01b 13/00, H05k 3/00

[58] Field of Search ............................................24/624–631

[56] References Cited

UNITED STATES PATENTS

| | | | |
|---|---|---|---|
| 3,334,395 | 8/1967 | Cook | 29/628 |
| 3,371,249 | 2/1968 | Prohofsky | 29/628 |

*Primary Examiner*—John F. Campbell

*Assistant Examiner*—Donald P. Rooney

*Attorney*—Hill, Sherman, Meroni, Gross & Simpson

[57] ABSTRACT

Production of multi-layered electrical circuit boards which have closely spaced circuit elements is accomplished by applying a solder-resistant lacquer coating to the outside surfaces of a plurality of conductor plates affixed together in juxtaposed relationship, producing bores through the plurality of circuit boards in a predetermined relationship to their circuitry placed thereon, depositing a first copper layer by currentless means upon the bore wall and the solder-resistant lacquer coated surface, applying a galvanic-proof coating to the copper metal layer in predetermined areas leaving soldering eyes free of the galvanic-proof coating, galvanically coating the bores inclusive of the soldering eyes with a second copper reinforcing layer, applying an etch-proof metal layer on the surface of said copper reinforcing layer, removing the galvanic-proof lacquer layer and the first copper layer by etching on the places not covered by the etch-proof metal layer.

10 Claims, 7 Drawing Figures

INVENTOR
HANS-HERMANN MERKENSCHLAGER

BY [signature] ATTORNEYS

PROCESS FOR THE PRODUCTION OF A CIRCUIT BOARD

BACKGROUND OF THE INVENTION

1. Field of the Invention

This invention generally relates to electrical equipment and particularly concerns a process for the production of printed circuit boards having fine and/or closely spaced circuits thereon in which a solder-resistant coating is applied over the circuits on the outer surfaces of the board to prevent solder bridges.

2. Prior Art

Boards with high density circuits thereon having small spacing between the circuit elements or conductors must be covered with a solder-resistant lacquer on the side which is to be soldered in order to avoid solder bridges between these closely spaced electrical current conductor elements. This is especially important in the case of machine soldering of the constructional elements such as by a solder bath. It is also important in the production of circuit boards that the soldering eyes of the conductor plates must remain free of solder-resistant lacquer in order to achieve positive and reliable soldering connections. The achievement of the above important design requirements of very fine and closely spaced conductor configurations has created tolerance problems in the applying of the solder-resistant lacquer which has been an extremely difficult problem in the prior art.

One solution of the prior art has been to eliminate the solder-resistant lacquer layer and provide instead an additional outer layer which contains a soldering eye pattern. In this construction, however, the outer layer has the disadvantage that in multi-layer construction the conductor boards lying under it are accessible for subsequent repairs only with greater difficulty. This is very unsatisfactory.

SUMMARY OF THE INVENTION

Accordingly it is an object of the present invention to overcome the disadvantages of the prior art by providing a method by which production of electrical conductor boards with very fine and close-spaced conductor configurations may be accomplished simply, surely and accurately with the use of a solder-resistant lacquer layer.

The solution to the problems of the prior art is accomplished by the method according to the present invention in which a solder-resistant lacquer is applied onto the outer surface of a circuit patterned conductor board before the production of bores which allow the interlayer contacting and constructional element reception. After at least one bore and in most cases a plurality of bores have been produced through the circuit board or boards in a predetermined position with respect to the circuit patterns of the boards, a first copper layer is deposited upon the solder-resistant coating surface and in the bore or bores. The solder-resistant coating is of a material to which copper deposited without current adheres well and therefore the first copper layer is advantageously deposited without current on the solder-resistant coating. In practice the deposition of the copper layer is effected by immersing the plate or board in a copper-salt bath which is not stable.

A galvanic-proof coating is next applied to the first copper layer in predetermined areas to leave the soldering eyes and the bore free of the galvanic-proof coating. The galvanic-proof coating may be advantageously applied to the first copper layer in predetermined areas by initially coating the entire first copper layer with a galvanic-proof photo-lacquer, next exposing the photo-lacquer to light in a known manner according to the soldering eye and bore pattern and then removing the galvanic-proof photo-lacquer in a known manner from the areas which are in the soldering eye and bore pattern. Application of the solder-resistant coating and the galvanic-proof coating may be effected by roller means rolled across the surface of the boards.

With the galvanic-proof coating in place except over the areas of the soldering eyes and the bores a second copper layer is galvanically applied to the bores inclusive of the soldering eyes to reinforce and thicken the first copper layer. An etch-proof metal coating is then applied on the surface of the second copper layer and since the second copper layer is applied only in the areas where there is no galvanic-proof coating it is advantageous to apply the etch-proof metal coating galvanically. With the etch-proof metal coating in place the galvanic-proof coating and the first copper layer are completely removed by etching on the places not covered by the etch-proof metal layer.

While it is possible that the method according to the present invention may be used on a single circuit board it achieves its greatest utility when the circuit board comprises a plurality of carrier boards held together in juxtaposed relationship to form a multi-layered circuit board having opposite outer surfaces on which there are formed circuit conduction patterns. These circuit patterns may be provided or "printed" on the outer surfaces of the multi-layered circuit board by the steps of providing a copper coating on the outer surfaces, covering the copper coating with an etch-proof coating according to the circuit pattern to be produced, removing the etch-proof coating in the areas not in the circuit pattern, removing the copper layer in the areas not protected by the etch-proof coating and then removing the etch-proof coating to leave the copper layer in a circuit pattern. It is to this copper layer in the circuit pattern that the solder-resistant coating is applied.

BRIEF DESCRIPTION OF THE DRAWING

Other objects, features and advantages of the invention will be readily apparent from the following description of certain preferred embodiments thereof, taken in conjunction with the accompanying drawing, although variations and modifications may be effected without departing from the spirit and scope of the novel concepts of the disclosure, and in which.

DESCRIPTION OF THE PREFERRED EMBODIMENT

Figures 1, 2, 3, 4, 5, 6, 7:
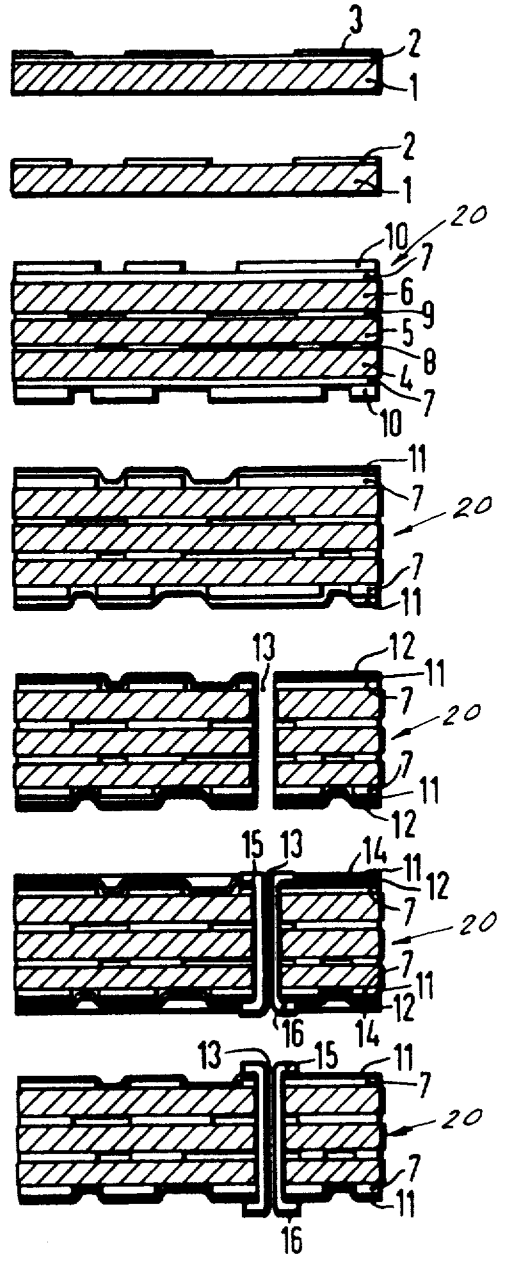
FIGS. 1 and 2 illustrate one method for the production of an electrical circuit pattern on a carrier board.
FIG. 3 illustrates a step similar to that of FIG. 1 in the production of an electrical circuit pattern on the outer layers of a multi-layered board.
FIG. 4 illustrates the board after the step of applying the solder-resistant coating to the outer surfaces of the multi-layered board.
FIG. 5 illustrates the board with the bore formed therethrough and a first copper layer over the solder-resistant coating and in the bore.
FIG. 6 illustrates the board after the addition of a galvanic-proof coating, galvanic reinforcement of the copper layer in the bores or soldering eyes and galvanic deposit of an etch-proof metal coating over the second copper layer.
FIG. 7 illustrates the multi-layer board as completed with the removal of the galvanic proof coating and the first copper layer.

FIGS. 1 and 2 are illustrative of a method for the production of an electrical "printed" circuit on a carrier board 1 which may serve as a component of the multi-layered board illustrated in FIGS. 3 through 7. Thus, the board 1 is provided with a copper cladding or coating 2 on which an etch-proof lacquer or coating 3 has been provided thereon in a conventional manner in the pattern of the conduction circuit to be produced in the copper layer 2. In practice the etch-proof coating 3 may be a photo-lacquer which has been exposed to light in the pattern of the circuit to be produced and the portion exposed or not exposed has been removed to leave the etch-proof coating over the copper in the area of the circuit. Thereafter the copper is etched in the parts of the copper layer 2 not covered by the etch-proof photo-lacquer. Upon completion of the etching the etch-proof coating is removed to leave the carrier plate 1 with the circuit conduction pattern 2 as shown in FIG. 2.

After a plurality of boards 1 have had circuits applied thereto they may be formed into a multi-layered plate as shown in FIG. 3 for example by pressing them together to bond them and form a laminate. FIG. 3 illustrates three carrier plates 4, 5 and 6 having inner circuit patterns 8 and 9 bonded together to form a multi-layered circuit board generally indicated at 20. As shown the circuit board 20 has coatings of copper 7 on its opposite outer surfaces. The coating 7 in turn has thereon an etch-proof coating 10 according to the circuit patterns to be produced so that the uncovered parts of the copper coating 7 may be etched out in a manner as set forth with regard to the description of FIGS. 1 and 2 to produce a circuit pattern 7 on each of the outer surfaces of the board 20. The resultant circuit board is illustrated in FIG. 4 with a solder-resistant coating 11 applied to each of the outer surfaces. It is to be understood that the circuit patterns 7 on each of the outer surfaces may be different and in fact only one side may have a circuit thereon. Also, while the circuits 8 and 9 are shown as extending completely between the component boards 4, 5 and 6 it will be understood that they may be spaced from one of the adjacent boards by a suitable bonding material. Furthermore, the areas between the elements of each of the circuits 8 and 9 may be filled with the bonding material so that there are no air spaces and the circuit board 20 in effect is solid. The chemical composition of the etch-resistant coatings and photo-lacquers are conventional and may be of suitable manufacture. With regard to the solder-resistant coating it has been found that the "novoprint" lacquer manufactured by the Schering company is suitable. The solder-resistant lacquer coating 11 preferably is of a material to the surface of which copper deposited without current adheres well. This coating may be rolled on or applied in other suitable manner to form a coating as shown in FIG. 4.

After the solder-resistant coating 11 has been applied a bore 13 or bores may be provided in a suitable manner to extend through the circuit board 20 placed as required for the reception of the constructional elements and for through contacting between any of the circuits 7, 8 or 9. Following the production of the bores a first copper layer 12 is deposited as shown in FIG. 5 on the surface of the lacquer layer 11 and in the bore 13. The first copper layer 12 advantageously is deposited without current and may be effected by immersing the board 20 in a copper-salt bath which is not stable so that copper precipitates therefrom. Since the copper layer precipitated by currentless metallizing is extremely thin it has been found expedient to strengthen or thicken the copper layer 12 by galvanic depositing of a further copper layer up to a thickness of about $5\mu$.

Referring to FIG. 6 there is shown the board after the addition of a galvanic-proof lacquer layer coating 14 over the first copper layer 12 with the exception of the areas in the pattern of the soldering eyes or bore 13. The galvanic-proof coating having a particular pattern leaving the soldering areas free may be effected by applying the galvanic-proof photo-lacquer coating 14 over the entire surface, next exposing the photo-lacquer to light in a known manner according to the soldering eye pattern whereby the portions of the photo-lacquer layer coating in the areas which are to form the soldering eyes or bores may be removed in a known manner leaving these areas free of the galvanic-proof coating.

After the galvanic-proof coating 14 has been applied to leave the soldering eyes or bores free, the first copper layer 12 in the bores and on the soldering eyes is thickened and reinforced by a second copper layer 15 which is galvanically deposited up to the desired thickness as shown in FIG. 6. With the galvanic-proof coating 14 and the second copper layer 15 in place, an etch-proof metal coating 16 of tin is applied galvanically to the second copper layer. This etch-proof metal coating adheres only in the areas of the second copper coating and serves as a preparation for the final steps wherein the galvanic-proof lacquer layer coating 14 is removed in a conventional manner and the first copper layer 12 is removed by etching. The etch-proof coating 16 prevents etching in the area of the second copper layer 15 with the result that a final product is produced as shown in FIG. 7. Thus there may be seen a multi-layered plate with reinforced metallization in the area of the bore walls and soldering eyes and a solder-resistant coating on the other portions of the outside surface which protects against the formation of solder bridges on fine and/or closely spaced circuits.

From the above noted description it may be seen that there has been produced a sure, simple and accurate way of achieving soldering connections between circuit elements or conductors which are closely spaced. This is especially advantageous where the solder is to be applied by machine as for example in a solder bath.

Although minor modifications might by suggested by those versed in the art, it should be understood that I wish to embody within the scope of the patent warranted hereon all such modifications as reasonably and properly come within the scope of my contribution to the art.

I claim as my invention:

1. A method for the production of electrical circuit boards comprising the steps of applying a solder-resistant coating to the outside surfaces of a circuit conductor carrier board having a circuit pattern thereon, producing at least one bore through the circuit board in a predetermined position with respect to the circuit pattern, depositing a first copper layer upon the solder resistant coating surface and on the walls created by said bore, applying a galvanic-proof coating to said first copper layer in predetermined areas leaving soldering eyes and said bore walls free of the galvanic-proof coating, galvanically applying a second copper layer to the bore walls inclusive of the soldering eyes to reinforce said first copper layer, applying an etch-proof metal coating on the surface of said second copper layer, removing the galvanic-proof coating and the first copper layer by etching on the places not covered by the etch proof metal layer.

2. A method according to claim 1 wherein the circuit board comprises a plurality of carrier boards held together in juxtaposed relationship to form a multi-layered circuit board having opposite outer surfaces.

3. A method according to claim 2 wherein the multi-layered circuit board has a circuit conduction pattern on each of its two opposite outer surfaces which conduction pattern is formed on the outer surfaces after the multi-layered board has been formed.

4. A method according to claim 3 wherein the circuit pattern is provided on the outer surfaces of the multi-layered circuit board by providing a copper coating on said outer surfaces, covering the copper coating with an etch-proof coating according to the circuit pattern to be produced, removing the etch-proof coating in the areas not in the circuit pattern, removing the copper layer in the areas not protected by the etch-proof coating and removing the etch-proof coating to leave the copper layer in the circuit pattern.

5. A method according to claim 3 wherein said bore extends through a plurality of circuits interconnecting said circuit pattern on each of said outer surfaces.

6. A method according to claim 1 wherein said solder-resistant coating is of a material to which copper deposited without current adheres well and wherein said first copper layer is deposited without current on the solder-resistant coating and on said bore walls.

7. A method according to claim 6 wherein the currentless deposition of the copper layer is effected by immersing the plate in a copper-salt bath which is not stable.

8. A method according to claim 1 wherein said galvanic-proof coating is applied to said first copper layer in predetermined areas by initially coating said entire first copper layer with a galvanic-proof photo-lacquer; next exposing said photo-lacquer to light in a known manner according to the soldering eye and bore pattern desired and then removing the galvanic-proof photo-lacquer coating in a known manner from the areas which are in the soldering eye and bore pattern.

9. A method according to claim 1 wherein said etch-proof metal coating is tin which is applied galvanically to said second copper layer.

10. A method according to claim 1 wherein the solder-resistant coating and galvanic-proof coating are applied by means of rollers moved across the surface of the boards.

* * * * *